US007606055B2

(12) United States Patent  
Liu (10) Patent No.: US 7,606,055 B2
(45) Date of Patent: Oct. 20, 2009

(54) MEMORY ARCHITECTURE AND CELL DESIGN EMPLOYING TWO ACCESS TRANSISTORS

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 11/419,133

(22) Filed: May 18, 2006

(65) Prior Publication Data

US 2007/0268742 A1 Nov. 22, 2007

(51) Int. Cl.
*G11C 5/02* (2006.01)
(52) U.S. Cl. .............................. 365/51; 365/63; 365/163
(58) Field of Classification Search ................ 365/51, 365/63, 163
See application file for complete search history.

(56) References Cited

U.S. PATENT DOCUMENTS

| | | | | |
|---|---|---|---|---|
| 5,923,593 | A * | 7/1999 | Hsu et al. ............... | 365/189.04 |
| 6,839,267 | B1 * | 1/2005 | Poechnueller ............... | 365/149 |
| 7,095,647 | B1 * | 8/2006 | Jenne et al. ................. | 365/158 |
| 2006/0120148 | A1 * | 6/2006 | Kim et al. .................... | 365/163 |

OTHER PUBLICATIONS

S.H. Lee et al., "Full Integration and Cell Characteristics for 64Mb Nonvolatile PRAM," 2004 Symp. on VLSI Technology Digest of Technical Papers, pp. 20-21 (2004).
S. Hudgens and B. Johnson, "Overview of Phase-Change Chalcogenide Nonvolatile Memory Technology," MRS Bulletin, pp. 829-832 (Nov. 2004).
F. Yeung et al., "Ge2Sb2Te5 Confined Structures and Integration of 64 Mb Phase-Change Random Access Memory," Japanese Journal of Applied Physics, vol. 44, No. 4B, pp. 2691-2695 (2005).
Y.N. Hwang et al., "Full Integration and Reliability Evaluation of Phase-change RAM Based on 0.24um-CMOS Technologies," 2003 Symposium on VLSI Technology Digest of Technical Papers, pp. 173-147 (2003).
W.Y. Cho, et al., "A 0.18-um 3.0-V 64-Mb Nonvolatile Phase-Transition Random Access Memory (PRAM)," IEEE Journal of Solid-State Circuits, vol. 40, No. 1, pp. 293-300 (Jan. 2005).
F. Bedeschi, et al., "An 8Mb Demonstrator for High-Density 1.8V Phase-Change Memories," 2004 Symposium on VLSI Circuits Digest of Technical Papers, pp. 442-445 (2004).

* cited by examiner

*Primary Examiner*—VanThu Nguyen
(74) *Attorney, Agent, or Firm*—Wong, Cabello, Lutsch, Rutherford & Brucculeri, LLP (57) ABSTRACT

An improved memory array architecture and cell design is disclosed in which the cell employs two access transistors. In one embodiment, the two access transistors in each cell are coupled at one of their channel terminals to a memory element, which in turn is connected to a bit line. The other of the channel terminals are effectively tied together via reference lines. The word lines (i.e., gates) of the two access transistors are also tied together. The result in a preferred embodiment is a cell having two access transistors wired and accessed in parallel. With such a configuration, the widths of the access transistors can be made one-half the width of more-traditional one-access-transistor designs, saving layout space in that (first) dimension. Moreover, because the word lines of adjacent cells will be deselected, the improved design does not require cell-to-cell isolation (e.g., trench isolation) in the other (second) dimension. The result, when applied to a phase change memory, comprises about a 37% reduction in layout area from previous cell designs.

8 Claims, 8 Drawing Sheets

MEMORY ARCHITECTURE AND CELL DESIGN EMPLOYING TWO ACCESS TRANSISTORS

FIELD OF THE INVENTION

Embodiments of the invention relate to an improved memory array architecture and cell design employing two access transistors which is particularly (but not exclusively) useful in the design of a phase change memory.

BACKGROUND

Semiconductor memory integrated circuits are in high demand, and the industry is always striving to improve the density of such devices. Currently, the Dynamic Random Access Memory (DRAM) is in widespread use. However, DRAM cells require a capacitor, which requires refreshing to preserve the stored data.

Accordingly, newer memory cell technologies are under consideration for the mass market. One such new memory technology is the Phase Change Random Access Memory (PCRAM). In a PCRAM, the capacitor of the DRAM cell is replaced with a phase change material, such as Germanium-Antimony-Telluride (GST) or other chalcogenide materials. An example of such a cell 30 as fabricated is shown in cross section in FIG. 1B, and is shown in schematic form in FIG. 1A. Because the structure and operation of PCRAMs are well known to those skilled in the art, they are only briefly described. The a PCRAM cell is an exciting alternative to traditional capacitor-based DRAM cells because they do not require refresh and are easily scalable. (Capacitors require a given surface area to store the requisite number of charges, and hence are not easily scaled).

As shown, each PCRAM cell 30 comprises an access transistor 32 and a phase change material 34. Each access transistor 32 is selectable via a word line (row) 20, which when accessed opens a transistor channel between a bit line (column) 24 and a reference line 22. The phase change material 34 is in series between the transistor channel and the cell selection line 24, and so can be set (i.e., programmed), reset, or read via the passage of current through the material. As is well known, phase change material 34 can be set by passing a current therethrough, which modifies the material into a more conductive crystalline state. This phase change of the material 34 is reversible, and so the material 34 may be reset back to an amorphous resistive state by the passage of even a larger amount of current through the material. Such phase changing occurs in the region 34a adjacent to the bottom electrode 42b as shown in FIG. 1B. Once set or reset to make the material 34 relatively conductive (denoting storage of a logic '1') or resistive (denoting storage of a logic '0'), the cell may be read by passing a relatively small current through the phase change material 34 and sensing the resulting voltage on the bit lines 24.

Processing of the PCRAM cell 30 uses standard semiconductor CMOS processing techniques, and does not require significant explanation to those of skill in the art. As shown in FIG. 1B, the cell 30 uses polysilicon gate for the word lines 20 as is common, and uses conductive plugs to contact the diffusion regions 44 in active portions of the silicon substrate. The phase change material 34 is sandwiched between top and bottom electrodes 42a and 42b. Contact from the bit line 24 to top electrodes 42a is established by plugs 40. Of course, conductive structures are surrounded by at least one dielectric material 35, such as silicon dioxide or silicon nitride as is well known. Pairs of adjacent cells 30 are isolated from one another using trench isolation 46, again a standard technique for isolating active structure in a silicon substrate.

Other details concerning PCRAM memory composition, operation, and fabrication can be found in the following references, all of which are incorporated by reference herein in their entireties: S. H. Lee et al., "Full Integration and Cell Characteristics for 64 Mb Nonvolatile PRAM," 2004 Symp. on VLSI Technology Digest of Technical Papers, pps. 20-21 (2004); S. Hudgens and B. Johnson, "Overview of Phase-Change Chalcogenide Nonvolatile Memory Technology," MRS Bulletin, pps. 829-832 (November 2004); F. Yeung et al., "$Ge_2Sb_2Te_5$ Confined Structures and Integration of 64 Mb Phase-Change Random Access Memory," Japanese Journal of Applied Physics, Vol. 44, No. 4B, pps. 2691-2695 (2005); Y. N. Hwang et al., "Full Integration and Reliability Evaluation of Phase-change RAM Based on 0.24 um-CMOS Technologies," 2003 Symposium on VLSI Technology Digest of Technical Papers, pps. 173-147 (2003); W. Y. Cho, et al., "A 0.18-um 3.0-V 64-Mb Nonvolatile Phase-Transition Random Access Memory (PRAM)," IEEE Journal of Solid-State Circuits, Vol. 40, No. 1, pps. 293-300 (January 2005); and F. Bedeschi, et al., "An 8 Mb Demonstrator for High-Density 1.8V Phase-Change Memories," 2004 Symposium on VLSI Circuits Digest of Technical Papers, pps. 442-445 (2004).

Figure 1A:
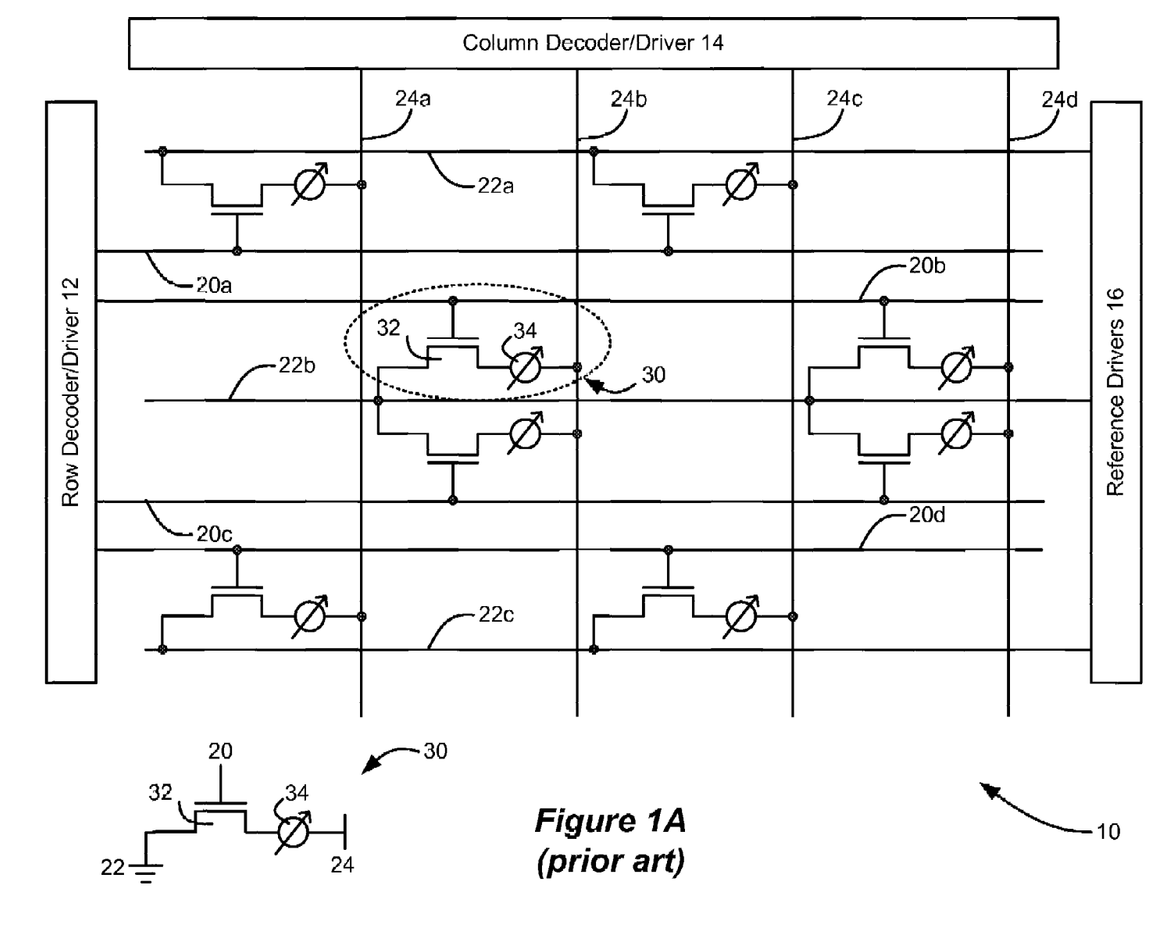
FIGS. 1A, 1B, and 1C illustrate a prior art design for a PCRAM memory array, and respectively show the array in schematic, cross sectional, and layout views.
Figure 1B:
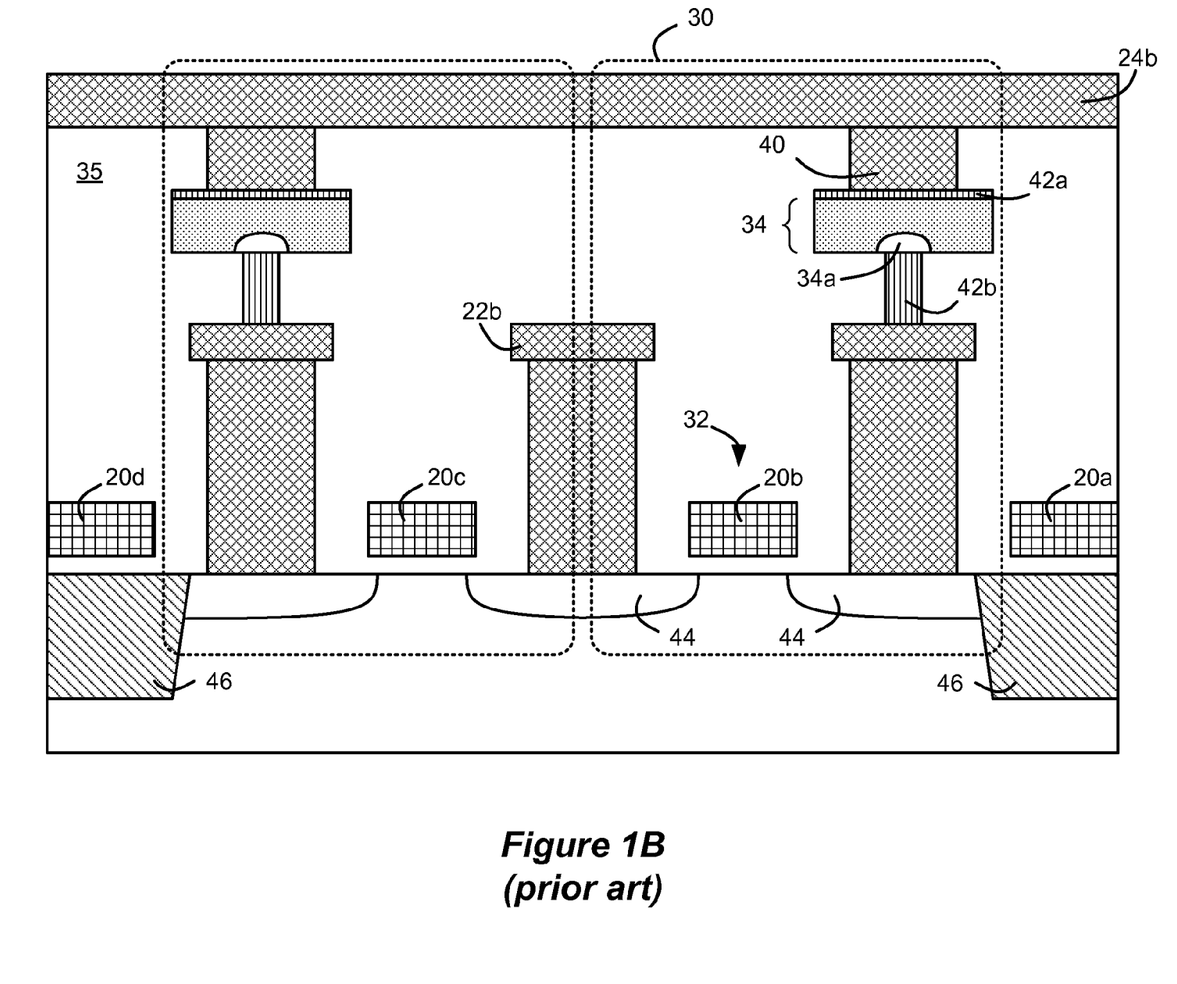
Figure 1C:
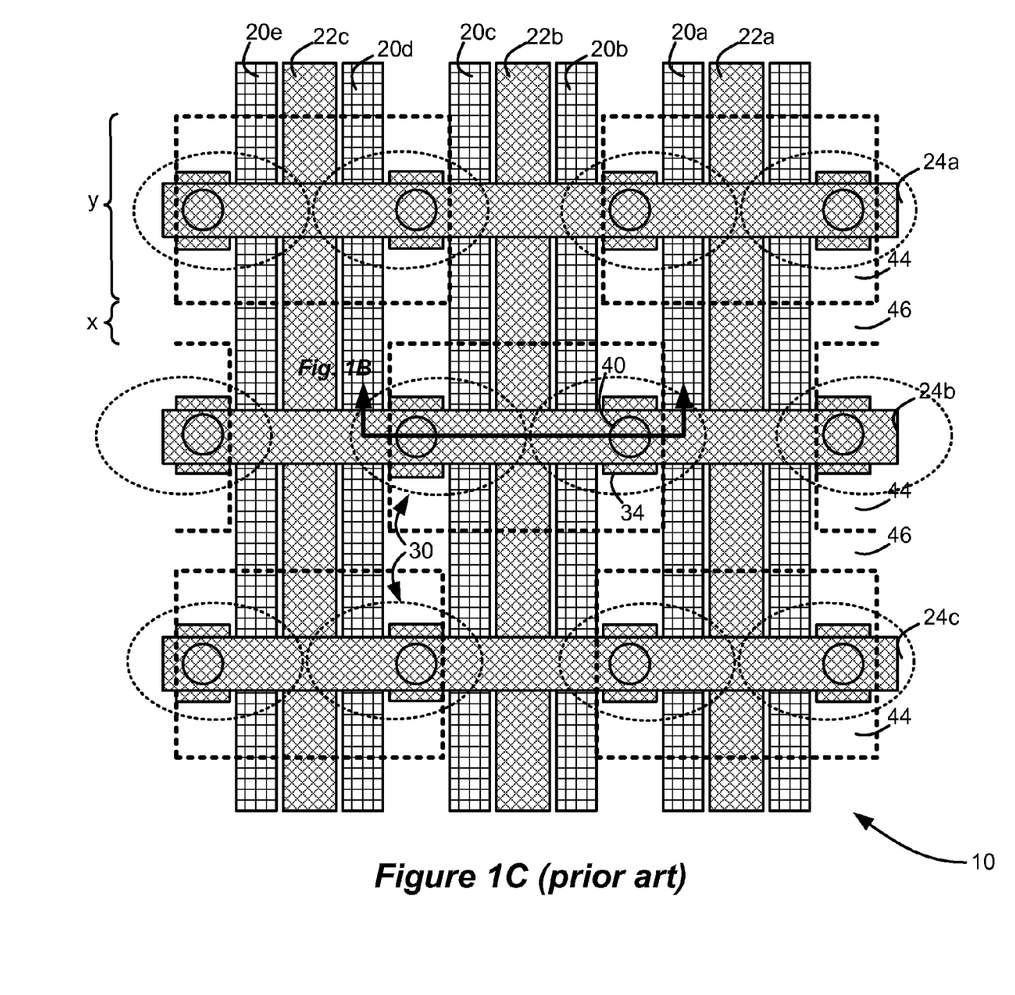

The layout of the PCRAM cells 30 in a memory array 10 is shown in a top view in FIG. 1C. The area corresponding to each cell 30 is generally demarked with a dotted-lined oval. As can be seen each reference line 22 is shared between a pair of cells 30 which also share the same bit line 24. Each of these pairs of cells 30 are contained within the same active silicon area, as shown by dotted lined box in FIG. 1C, which comprises the diffusion regions 44 and channel regions for the access transistors 32 each of the cells in the pair. Outside of these active regions, the silicon substrate comprises trench isolation 46 (see FIG. 1B), which isolates adjacent cells from one another. The minimum width 'x' of isolation required is dictated by layout design rules and can vary.

Laid out in this fashion, the array 10 of PCRAM cells 30 can be operated as follows. First, a cell 30 to be accessed is determined by the logic of the integrated circuitry in which the array is formed (not shown), and an appropriate word line 20 and bit line 24 are respectively activated via row decoder/driver circuitry 12 and column decoder/driver circuitry 14. The reference drivers 16 send a reference potential to each of the cells 30 in the array 10 at all times, which can be ground for example. An activated word line 20 can comprise a voltage sufficient to form a channel under the access transistors, e.g., 1.5V. The voltage to be placed on the selected bit line 24 depends on whether the accessed cell is being set or reset (collectively, "programmed"), or read. When the cell is being set, the voltage on the bit line might be approximately 2.0V, and when reset a higher voltage of perhaps 3.0V can be used. When the cell is being read, a smaller bit line 24 voltage is used (e.g., 0.5V), and the current draw through the bit line is assessed via sense amplifiers (not shown) in the column decoder/driver circuitry 14. Because such decoder/driver circuitry 12, 14, 16 is well known, it is not further discussed.

It has been discovered that the architecture of array 10 is not optimal and takes up too much space. Specifically, the layout of each cell 30 in the array of FIG. 1C has been estimated to encompass an area equivalent to $16F^2$, where F is the minimum lithography limit of the process used to fabricate the array 10. This is a relatively large area for a memory cell. In part, the relatively large size of the PCRAM cell is dictated by the relatively high currents (e.g., on the order of milliamps) used to set and reset the cells. Such large set and reset currents required access transistors 32 which are relatively wide, i.e., in which the active diffusion areas 44 of the silicon are 'y' wide as shown in FIG. 1C. Moreover, such large currents generally also require that the width of the trench isolation 46 between the cells also be relatively large (i.e., 'x') so as to prevent cross-talk between the cells. While such factors may naturally warrant cells designs for PCRAMs which are relatively large, the fact remains that there is room for improvement on this score. Indeed, this disclosure presents a cell design and array architecture for a PCRAM and other memories that allows for a denser array of cells.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

An improved memory array architecture and cell design is disclosed in which the cell employs two access transistors. The array architecture and cell design is particularly useful when employed in the content of a phase change memory, although they may be used in other contexts as well, such as in more-traditional ROM and RAM designs. In one embodiment, and to summarize one embodiment of the invention briefly, the two access transistors in each cell are coupled at one of their channel terminals to a memory element, which in turn is connected to a bit line. The other of the channel terminals are effectively tied together via reference lines. (Note: the bit lines and reference lines are reversible). Moreover, in one embodiment, the word lines providing a gate voltage to the gates of the two access transistors are tied together. The result in a preferred embodiment is a cell having two access transistors wired and accessed in parallel. With such a configuration, the widths of the access transistors can be made one-half the width of more-traditional one-access-transistor designs while preserving current handling capacity. This saves layout space in that (first) dimension. Moreover, because the word lines of adjacent cells will be deselected, the improved design does not require cell-to-cell dielectric isolation (e.g., trench isolation) in the other (second) dimension. The result, when applied to a phase change memory, is a cell design taking up a layout area of only approximately $10F^2$, or about a 37% reduction in layout area from the cell design of the prior art.

Figure 2A:
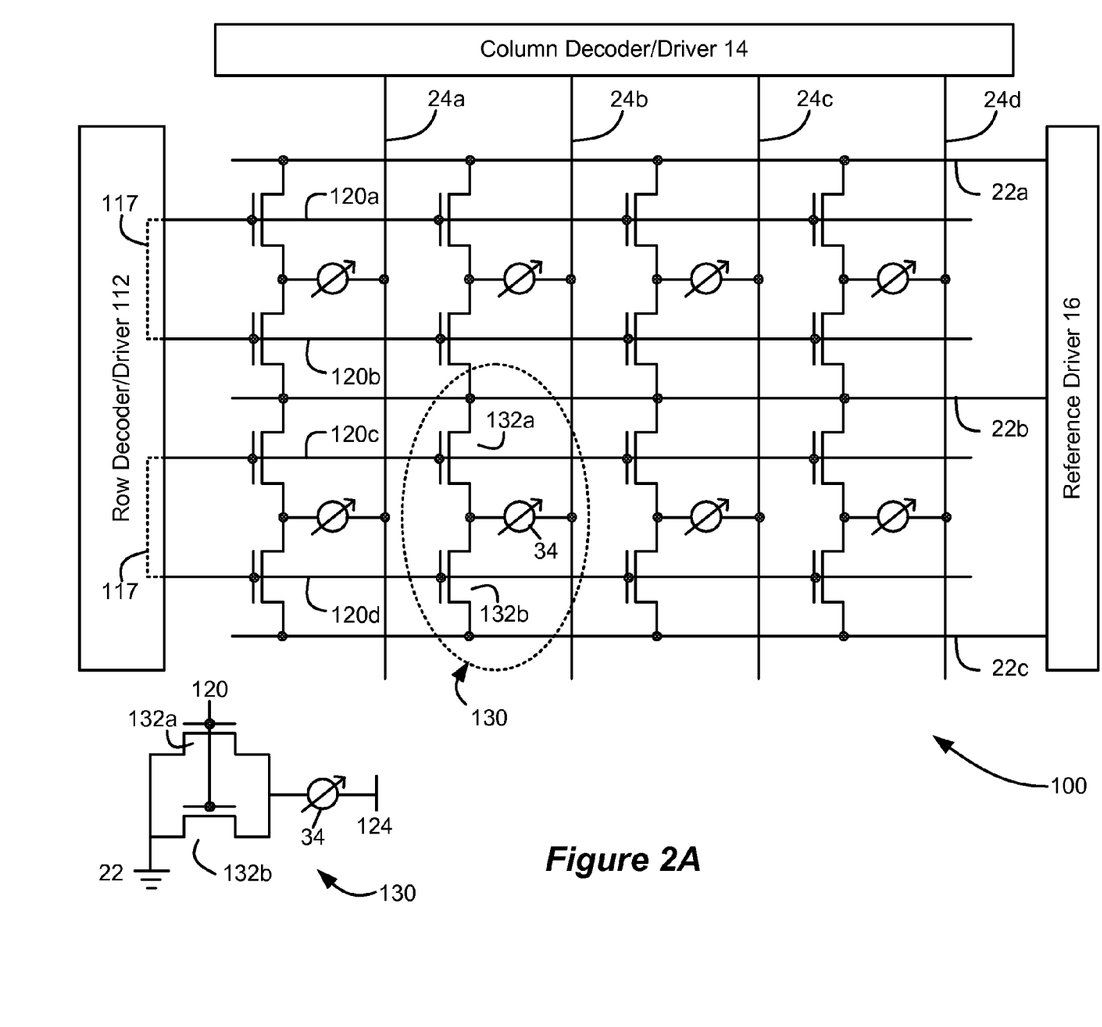
FIGS. 2A, 2B, and 2C illustrate a design for a PCRAM or other memory array in accordance with an embodiment of the invention, and respectively show the array in schematic, cross sectional, and layout views.
Figure 2B:
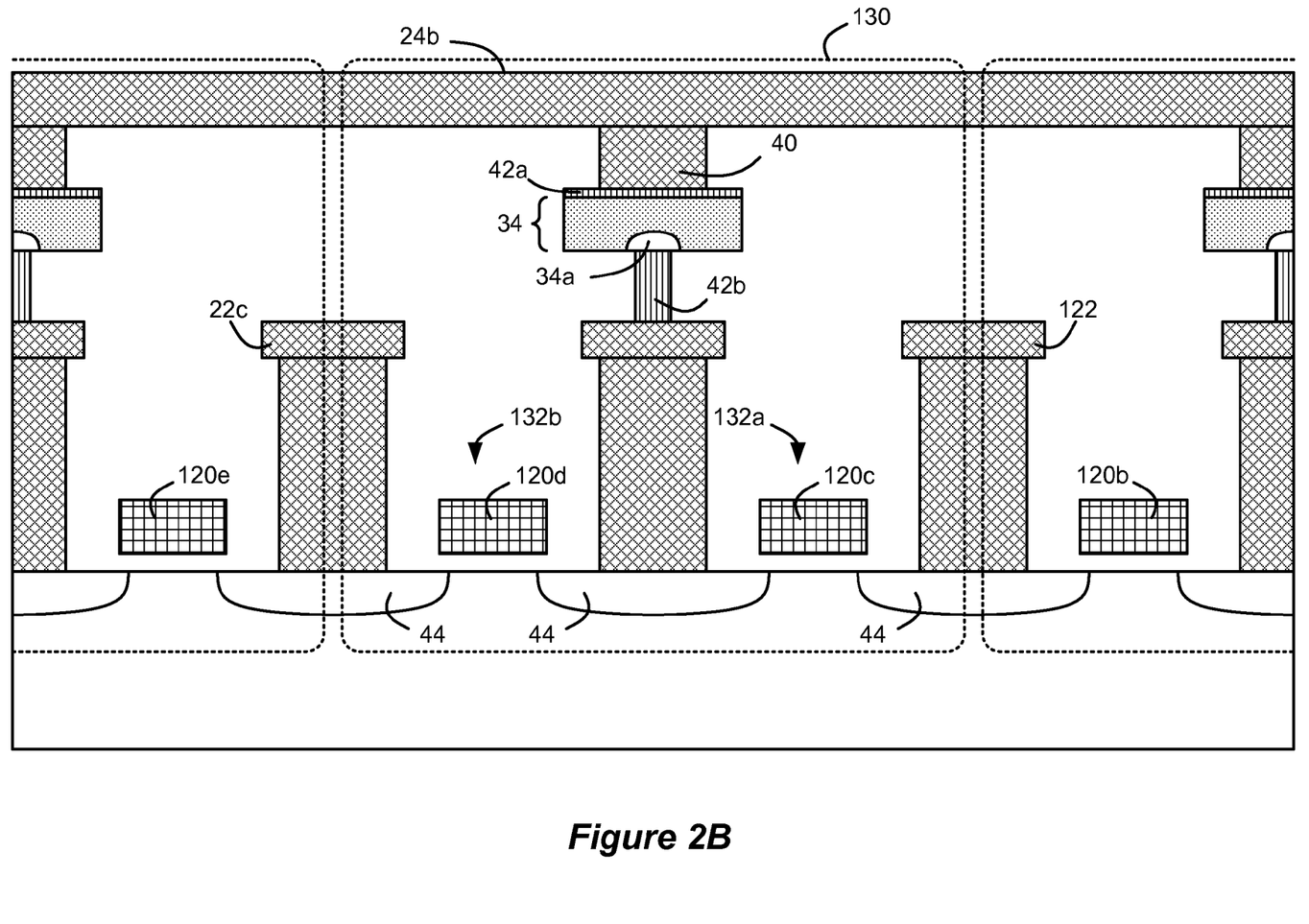
Figure 2C:
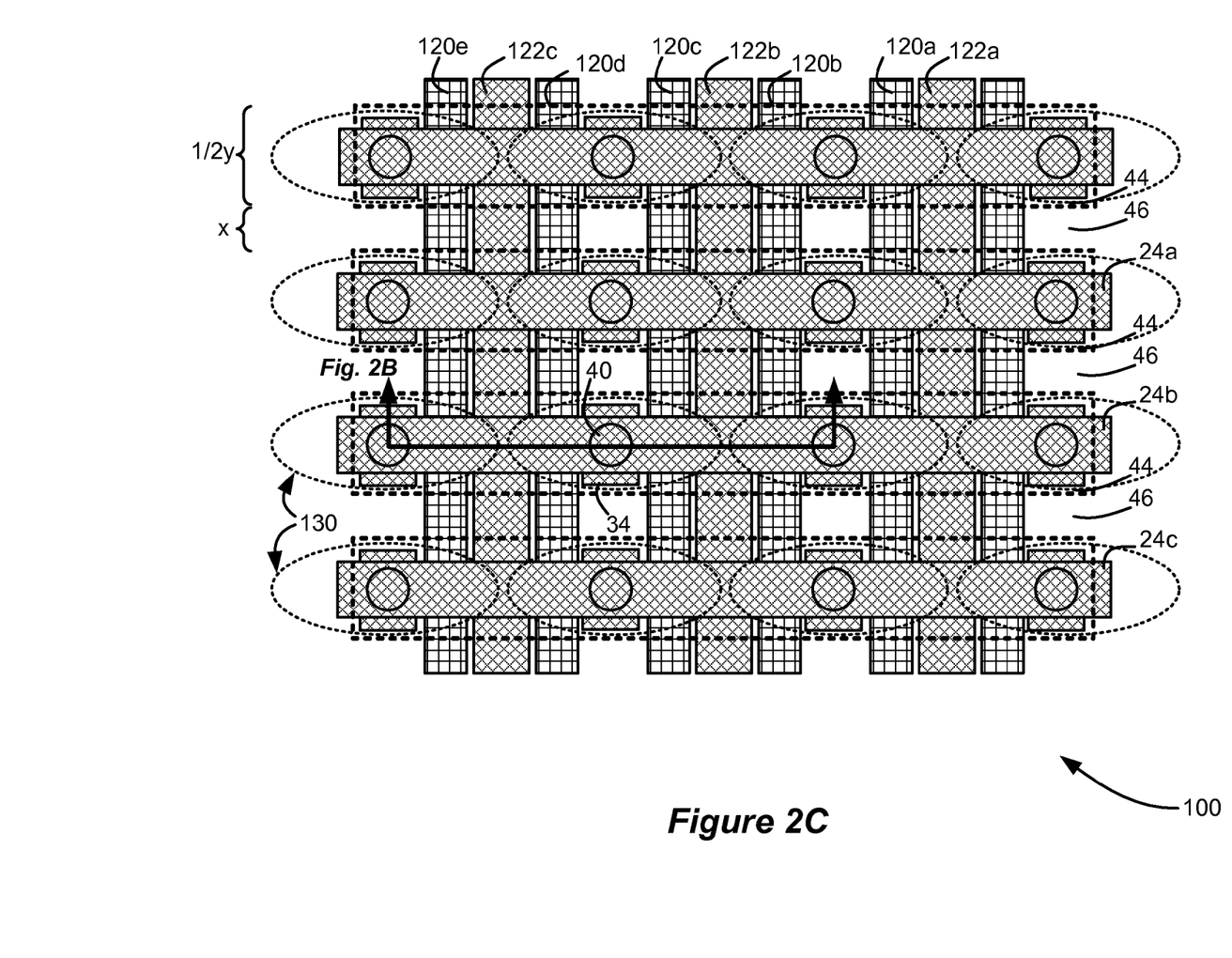

An embodiment of the improved PCRAM cell design and array architecture is shown in FIGS. 2A-2C, which basically corresponds to the same views of FIGS. 1A-1C as discussed in the Background. To the extent structures in the improved design are not changed from the prior art design discussed in the background, they bear the same element numerals.

The first feature to be noticed in the new design is the cell 130. As shown, each cell 130 comprises two access transistors 132a, 132b. In a preferred embodiment, the word lines 120 for each of the access transistors in a cell 130 (i.e., word lines 120c and 120d for access transistors 132a and 132b) are tied together, for example, within or near the row decoder/driver circuitry 112, as exemplified by the dotted lines 117. When this is accomplished, the two access transistors 132a and 132b in each cell are simultaneously accessed.

Each of the access transistors 132 in each cell 130 are coupled together at a channel terminal to the lower electrode 42b of the phase change material 34, which all share a common diffusion region 44 in the substrate. The other side (i.e., terminal) of the phase change material is in turn coupled via its upper electrode 42a to its bit line 24 as was the case with the prior art (see FIG. 2B). The other channel terminals of the access transistors are coupled to different references lines 22 (e.g., 22b and 22c), and hence to different diffusion regions 44. However, because each of the reference lines 22 are preferably tied via reference drivers 16 to a common potential (e.g., ground), the resulting circuit for each cell 130 in the improved array 100 is as illustrated to the lower left in FIG. 2A. To summarize, in the improved cell design of FIG. 2A, two access transistors 132a, 132b are effectively wired together in parallel.

At first blush, it would appear that the improved cell design 130 is not optimal, as it requires the use of two access transistors 132 as compared to a single access transistor 32 in the prior art. Convention wisdom would therefore suggest that the new cell design 130 would be larger than the old cell design 130. However, as shown in the layout perspective of FIG. 2C, this is not the case. As shown in FIG. 2C, the location of each two-transistor cell 130 is roughly bounded by the dotted-lined oval. When FIGS. 1C and 2C are compared, it is noticed that the cell density of the new cell design 130 is higher than that of the old cell design 30, despite the fact that the new cell design comprises two access transistors 132. In fact, estimations show that the new cell design 130 encompasses an area of approximately only $10F^2$. Thus, when compared with the old design 30 of $16F^2$, the new cell 130 results take up an area that is approximately 37% smaller.

There are two main reasons for the improved cell density in the new design. First, because two access transistors 132 are available to carry the cell's current, the access transistors can be half of the width ('½y') of the single access transistor 32 of the prior art ('y'). Accordingly, the bit lines 24 in the array 100 can be placed '½y' closer together.

Second, the improved cell architecture makes it unnecessary to use trench isolation 46 in the dimension perpendicular to the rows/word lines 120. This is perhaps best illustrated in FIG. 2B. As discussed earlier, access to cell 130 would involve the simultaneous selection of word lines 120d and 120c, e.g., by placing a voltage of 1.5V on those gates. However, this would mean that all other word lines 120 are inactive, e.g., grounded, such as adjacent gates 120e and 120b in FIG. 2B. Because no channel will form under these deselected gates, activation of cell 130 will not disturb adjacent cells. In effect, the deselected transistors gates 120e and 120b function similarly to the trench isolation 46 of the prior art cell 30/array 10 (see FIG. 1B). Accordingly, while the improved cell 130 is naturally longer in this dimension because of the use of two access transistors 132, that increase is offset by reductions afforded by disposing of the trench isolation 46 in this dimension.

To summarize, the disclosed embodiment of an improved cell 130/array 100 for a PCRAM achieves a smaller density than had otherwise been disclosed in the prior art. Moreover, such improved design requires almost no changes to the decoder/driver circuitry used to bias the array, the only significant change being splitting the signal for the selected row between two word lines 120 (see row decoder/driver 112 of FIG. 2A).

Figure 3:
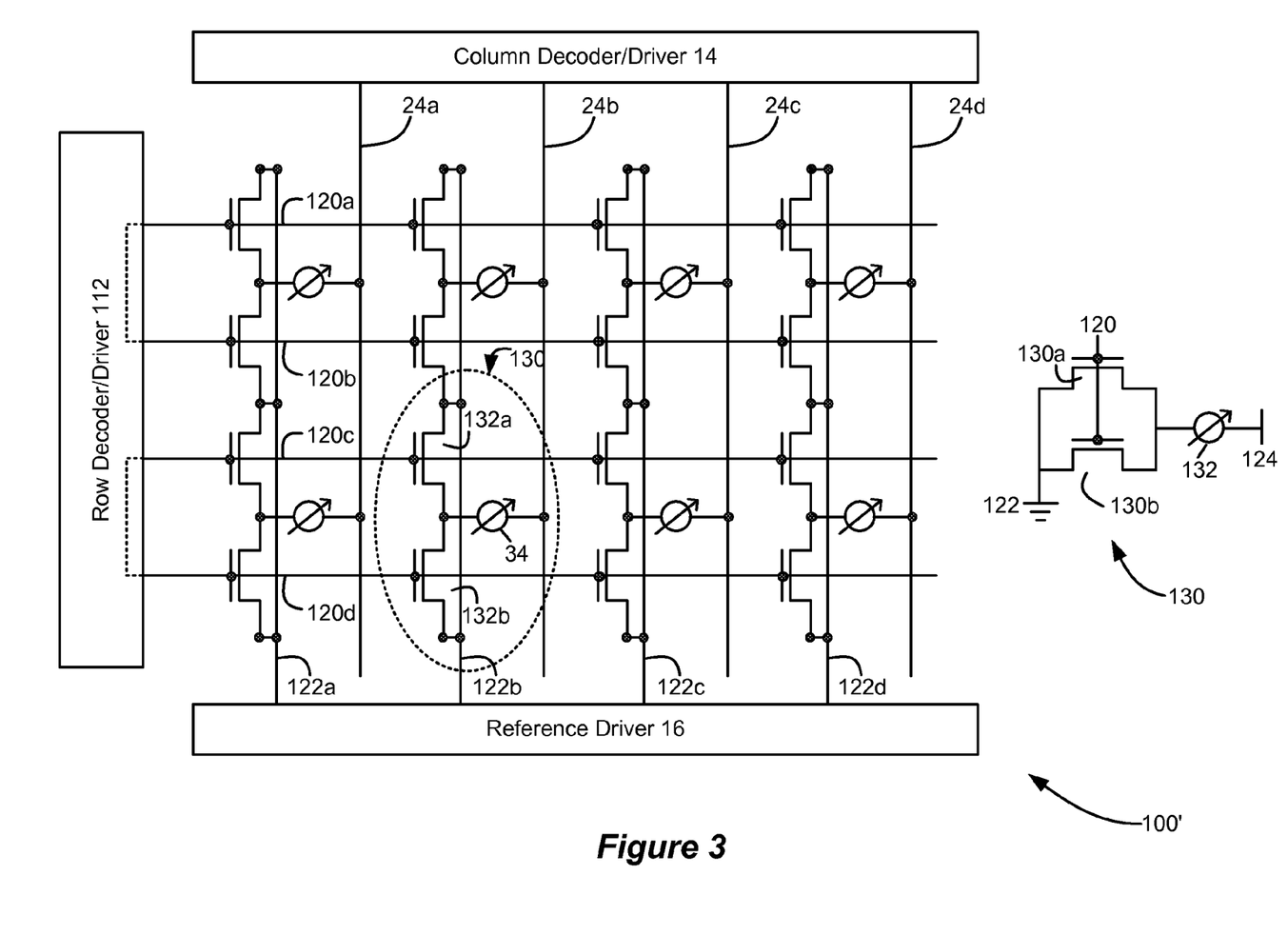
FIG. 3 illustrates an alternative design to that shown in FIGS. 2A-2C in which the reference lines are parallel with the bit lines in the array.

In the embodiment of FIG. 2, note that the reference lines 22 run parallel with the word lines 120 and perpendicular to the bit lines 24. However, as shown in the alternative schematic of FIG. 3, this orientation of the reference lines 24 can changed such that they are perpendicular to the word lines 120 and parallel to the bit lines 24. Given the layout and fabrication details already disclosed, one skilled in the art would easily understand how to make such an alternative, and hence superfluous cross-sectional and layout views of this alternative are not shown.

Although disclosed in the context of an improved cell design/array architecture for a PCRAM, it should be understood that embodiments of the invention are not so limited. For example, the cell design/array architecture can be used with other types of memory elements aside from phase change materials 34. In one simple example, the phase change material 34 in each cell could be modified to comprise a one-time programmable fuse or antifuse, allowing for the formation of a Programmable Read Only Memory (PROM). Moreover, the disclosed techniques can be applied to the fabrication of other memory technologies, such as RRAMs (Resistance Random Access Memories), and MRAMs (Magnetic Random Access Memory), which may also need relatively large programming currents. In short, while the disclosed embodiment is particularly useful in the context of a PCRAM, it is not so limited and indeed may apply to other memory elements (e.g., fuses, antifuses, etc.) as well.

Figure 4:
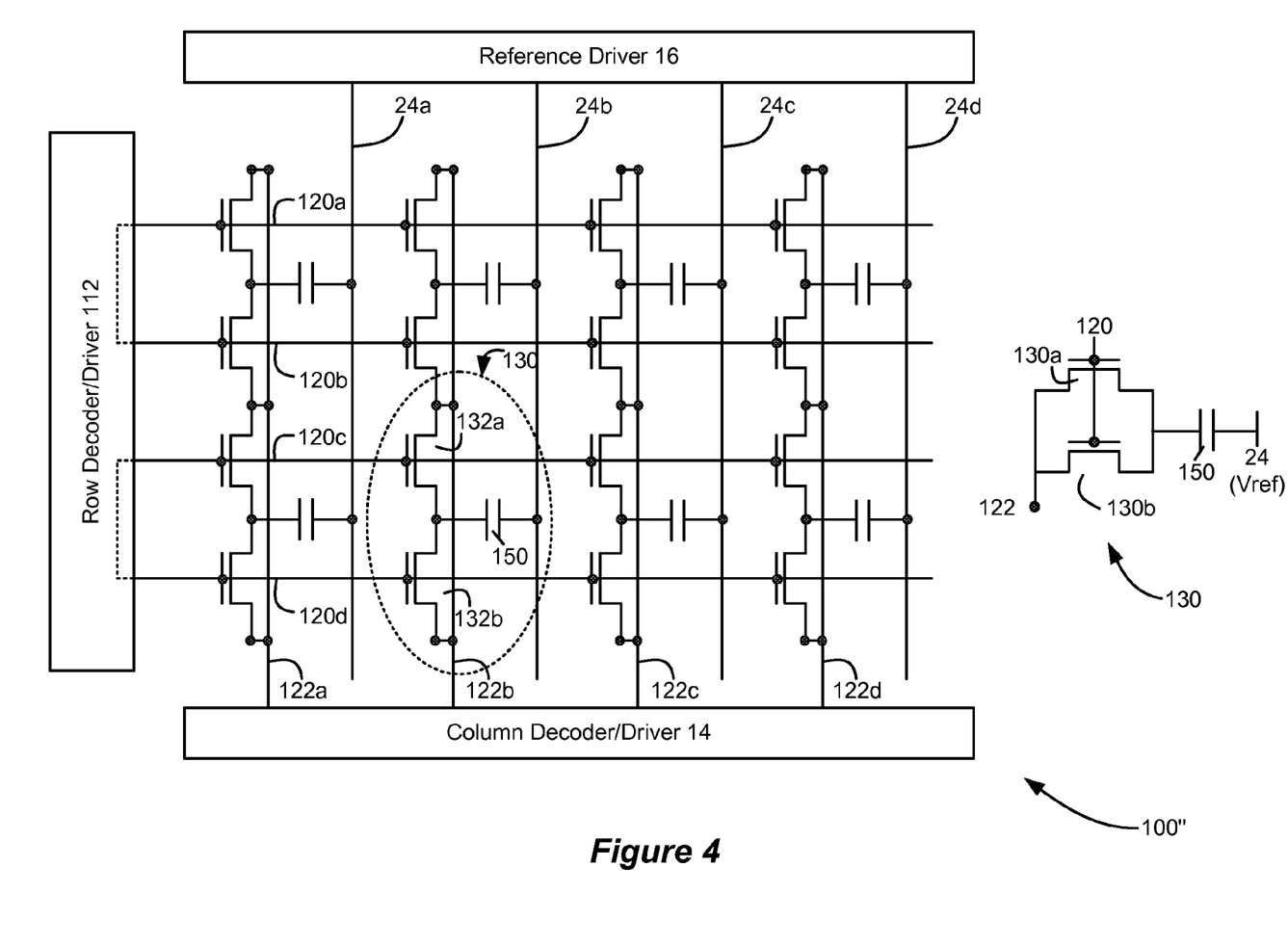
FIG. 4 illustrates an embodiment of the invention applied in the context of a DRAM memory.

Indeed, the disclosed cell design/array architecture can be used with DRAMs as well, as shown in FIG. 4. As shown, storage capacitors 150 have taken the place of the phase change material 34. Additionally, as compared to the schematic of FIG. 3, noticed that the reference driver 16 and column decoder/driver circuit 14 are exchanged. This exchange allows the reference drivers 16 to place a suitable reference potential on the reference plate of the storage capacitors 150 via reference lines 24, such as ½ Vdd as is typical in DRAM technologies. When the cell is accessed, both transistors 132 in the DRAM cell are selected as in earlier embodiments, with the result that the storage plate of the storage capacitor 150 is now coupled through both transistors 132 to its associated bit line 122, where it can be written to or read via the column decoder/driver circuitry 14. In short, the disclosed two-access-transistor/one-memory-element cell is applicable to traditional RAM technologies, as well as ROM, PROM, or erasable PROM technologies.

Other modifications are possible. For example, although this disclosure has contemplated that both of the access transistors 132 be accessed in parallel (i.e., by essentially tying their word lines 120c, 102d together at the row decoder/driver 112 via 117), this need not always occur in other useful embodiments of a two-access-transistor cell. If the word lines 120c and 120d are decoupled as is more normal for a memory array, then each access transistor 132 in each cell 130 can be independently accessed. This can have advantages. For example, during a set operation, high currents are not needed through the access transistors and so only one (e.g., 132a) need to be activated. By contrast, during a higher-current reset operation, both access transistors 132a, 132b could be activated. A reading operation could likewise include activating one or both of the access transistors in each cell. Of course, such an embodiment would require modifications to the row decoder/driver circuitry, but such modifications are minor and easily achievable by those of skill in the art.

Additionally, it is not important to some embodiments of the invention which lines in the array act as sensing (bit) lines or reference lines as these are reversible. Moreover, although it has been disclosed that different operational conditions such as read, set, and reset are implementable by using different bit line voltages, it should be understood that different access transistor 132 gate voltages could be used as well. For example, during any of these operating conditions, the voltage on the bit lines 24 can be held constant, with the gate voltage of the access transistors 132 being increased to achieve an appropriate amount of drive current for the condition at hand. Thus, a high gate voltage can be used for setting, and a higher gate voltage for resetting. Such multiple gate voltages would ultimately require different voltages on the word lines 120, which in turn would require modifications to the row decoder/driver circuits 112. But tailoring such voltages is well within the skill on those skilled in the art, and hence is not further discussed. Moreover, the reference lines can also be separately addressed and biased as well to provide additional flexibility in other circuit designs.

While a preferred embodiment of the invention has been disclosed, it should be understood the circuitry as disclosed herein can be modified while still achieving the various advantages discussed herein. In short, it should be understood that the inventive concepts disclosed herein are capable of many modifications. To the extent such modifications fall within the scope of the appended claims and their equivalents, they are intended to be covered by this patent.

What is claimed is:

1. A memory cell for an integrated circuit, comprising:
   a memory element for storing a logic state, the memory element having a first terminal and a second terminal, wherein the second terminal of the memory element is connected to a bit line;
   a first access transistor having first and second channel terminals, wherein a first channel terminal of the first transistor is coupled to the first terminal of the memory element, and wherein the second terminal of the first access transistor is connected to a reference potential; and
   a second access transistor having first and second channel terminals, wherein a first channel terminal of the second transistor is coupled to the first terminal of the memory element, and wherein the second terminal of the second access transistor is connected to the reference potential, wherein the first channel terminals of the first and second access transistors comprise a common diffusion region in a substrate, and
   wherein the first and second access transistors are independently selectable by respective first and second word lines.

2. The memory cell of claim 1, wherein the second channel terminals of the access transistors do not share a common diffusion region in the substrate.

3. The memory cell of claim 1, wherein the memory element comprises a phase change material.

4. The memory cell of claim 1, wherein the memory element comprises a fuse or antifuse.

5. The memory cell of claim 1, wherein the memory element comprises a RRAM memory element or a MRAM memory element.

6. The memory cell of claim 1, wherein the memory element comprises a capacitor.

7. The memory cell of claim 1, wherein the memory element is formed above the substrate.

8. The memory cell of claim 7, wherein the memory element is formed above the first and second access transistors.

* * * * *